United States Patent

Nakano et al.

[11] Patent Number: 5,982,462
[45] Date of Patent: Nov. 9, 1999

[54] INVERSE STAGGER OR PLANAR TYPE THIN-FILM TRANSISTOR DEVICE AND LIQUID-CRYSTAL DISPLAY APPARATUS HAVING FLOATING GATE ELECTRODE WHICH IS CAPACITIVELY COUPLED WITH ONE OR MORE INPUT ELECTRODES

[75] Inventors: Akira Nakano, Miyagi-ken; Tadashi Shibata, 5-2 Nihondaira, Taihaku-ku; Tadahiro Ohmi, 2-1-17-301 Komegafukuro, Aoba-ku, both of Sendai-shi, Miyagi-ken, all of Japan

[73] Assignees: Frontec Incorporated; Tadashi Shibata; Tadahiro Ohmi, all of Miyagi-ken, Japan

[21] Appl. No.: 08/812,776

[22] Filed: Mar. 6, 1997

[30]     Foreign Application Priority Data

Mar. 21, 1996 [JP] Japan .................................. 8-055232

[51] Int. Cl.⁶ .......................... G02F 1/136; G02F 1/1345; H01L 29/04
[52] U.S. Cl. .............................. 349/43; 349/151; 349/46; 257/59
[58] Field of Search .................... 349/43, 151, 46; 257/59

[56]              References Cited

U.S. PATENT DOCUMENTS 5,084,905  1/1992  Sasaki et al. ........................... 357/71
5,097,297  3/1992  Nakazawa .................................. 357/4
5,166,085  11/1992  Wakai et al. ............................. 437/40
5,191,452  3/1993  Sarma ........................................ 359/59
5,258,657  11/1993  Shibata et al. ......................... 307/201
5,341,012  8/1994  Misawa et al. .......................... 349/151
5,436,481  7/1995  Egawa et al. ............................ 257/354
5,614,427  3/1997  Den Boer et al. ........................ 437/40
5,661,421  8/1997  Ohmi et al. ............................... 327/63

FOREIGN PATENT DOCUMENTS

63-274180  11/1988  Japan .
2-114674  4/1990  Japan .
3-6679  1/1991  Japan .

*Primary Examiner*—William L. Sikes
*Assistant Examiner*—Tarifur Chowdury
*Attorney, Agent, or Firm*—Brinks Hofer Gilson & Lione

[57]              ABSTRACT

A thin film transistor device with its leakage current being controlled is provided. With such a thin film transistor device incorporated, a liquid crystal display apparatus presents a high-contrast image at a reduced power consumption. The thin film transistor is formed on an insulating substrate. The gate electrode of the transistor is electrically floating gate electrode, which is capacitance coupled to one or more input electrodes. The liquid crystal display apparatus incorporates the thin film transistor in its switching element and/or driving circuit.

14 Claims, 10 Drawing Sheets

DRIVING SECTION　　　　PIXEL SECTION

INVERSE STAGGER OR PLANAR TYPE THIN-FILM TRANSISTOR DEVICE AND LIQUID-CRYSTAL DISPLAY APPARATUS HAVING FLOATING GATE ELECTRODE WHICH IS CAPACITIVELY COUPLED WITH ONE OR MORE INPUT ELECTRODES

BACKGROUND OF THE INVENTION

1. Field of the Invention

The present invention relates to a thin film transistor device and a liquid crystal display apparatus and, more specifically, to a high-performance thin film transistor device that allows its threshold value to be adjusted and a liquid crystal display apparatus that offers high-quality functions and an excellent image quality.

2. Description of the Related Art

Conventional active matrix liquid crystal display apparatuses comprise thin film transistors (TFT) arranged in a matrix on a glass substrate corresponding to pixels. The liquid crystal display apparatus drives the thin film transistors by providing sequentially them with image data through a separately manufactured driving circuit and then takes advantage of the orientation of liquid crystals to present an image.

Thus, the conventional liquid crystal display apparatus needs manufacturing steps in which the external driving circuit is mounted and a TFT board is connected to the driving circuit, and such steps are one of the factors that impedes a cost reduction of the liquid crystal display apparatus.

TFTs are typically manufactured by forming semiconductor thin film layers of amorphous silicon or polysilicon on a glass substrate. Although arranging a driving circuit on the substrate in a TFT structure is contemplated, power consumption arising from through currents is increased because a leakage current in the TFT structure is large compared with a driving circuit based on a crystalline silicon. For example, to construct a D/A converter, a number of TFTs will be required, and the amount of leakage current is accordingly increased.

When a TFT is employed as a switching device for a pixel, the leakage current in the TFT greatly affects image quality. Specifically, the TFT leakage current lowers a voltage between liquid crystals, degrading an image contrast. This also makes a multi-level gradation image presentation difficult.

Since a high-density and large screen liquid crystal display is in growing demand, amorphous silicon that permits a large area, uniform film forming at low temperatures is preferred. However, one of the disadvantages of amorphous silicon is its large leakage current, which presents difficulty presenting a high-contrast, multi-level gradation image. In view of a large mobility in amorphous silicon, a device needs to be enlarged, and the leakage current is even more increased.

SUMMARY OF THE INVENTION

Accordingly, it is an object of the present invention to provide a TFT structure which controls a leakage current and a liquid crystal display apparatus which, with such a TFT structure incorporated, improves image qualities such as an image contrast and reduces power consumption.

It is another object of the present invention to provide a liquid crystal display apparatus that permits a driving circuit to be constructed of a smaller number of devices integrally with pixel devices at a reduced manufacturing cost.

According to the present invention, the thin film transistor device formed on a substrate comprises a gate electrode that is an electrically floating gate electrode, wherein the floating gate electrode is capacitance coupled to at least one input electrode.

The thin film transistor of the present invention is an inverted stagger type thin film transistor. The thin film transistor is a stagger type thin film transistor or a planar type thin film transistor.

In the thin film transistor device of the present invention, the input electrode is formed at the same time as source and drain electrodes are formed.

In the thin film transistor device, gate insulating layers of the thin film transistor are made of at least two layers. There are a plurality of input electrodes, at least one of the input electrodes is capacitance coupled to the floating gate electrode via the first insulating layer of the two gate insulating layers, and at least one of the input electrodes is capacitance coupled to the floating gate electrode via the first and the second insulating layers of the two gate insulating layers.

There are a plurality of input electrodes, and at least one of the input electrodes is capacitance coupled to the floating gate electrode via an insulating layer other than the gate insulating layers or via the insulating layer and the gate insulating layer.

The liquid crystal display apparatus of the present invention incorporates the thin film transistor device in its switching element or its driving circuit of the liquid crystal display apparatus. The switching element and the driving circuit are integrally formed.

DESCRIPTION OF THE PREFERRED EMBODIMENTS

Figure 1A:
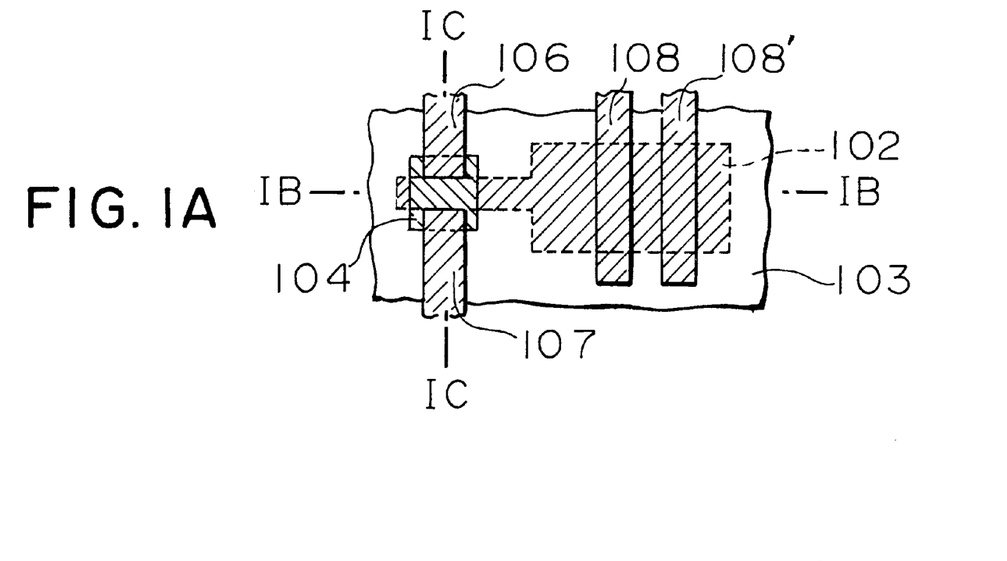
FIGS. 1A, 1B and 1C show the structure of a thin film transistor (TFT) of the present invention.
Figure 1B:
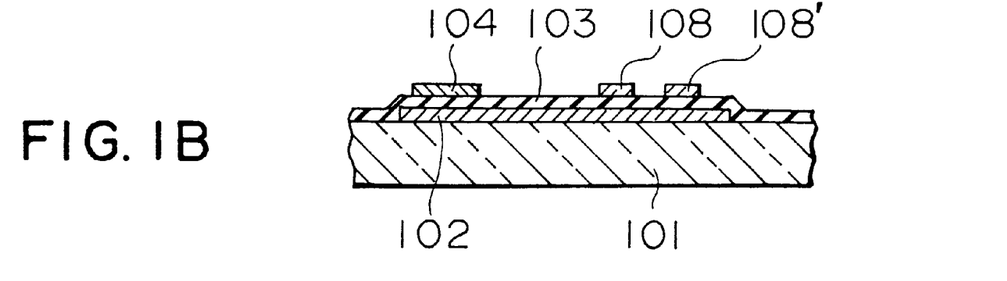
Figure 1C:
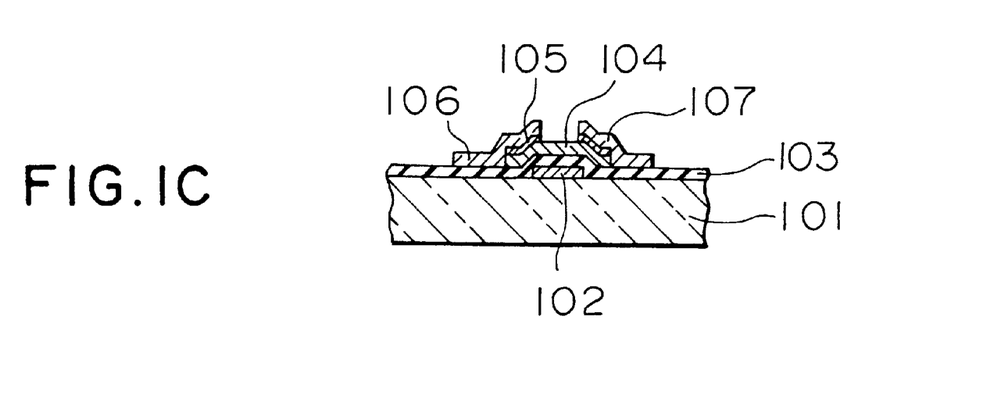

FIGS. 1A through 1C show one example of the TFT of the present invention. FIG. 1A is a plan view of the TFT, and FIGS. 1B and 1C are cross-sectional views respectively taken along with lines 1B—1B and 1C—1C in FIG. 1A.

FIGS. 1A through 1C show a glass substrate 101, a floating gate electrode 102, a gate insulating layer 103, a semiconductor layer 104, an ohmic contact layer 105, a source electrode 106, a drain electrode 107, and input electrodes 108 that are capacitance coupled to the floating gate electrode 102 via the gate insulating layer 103. As shown, two inputs electrodes 108 are employed.

Figure 2:
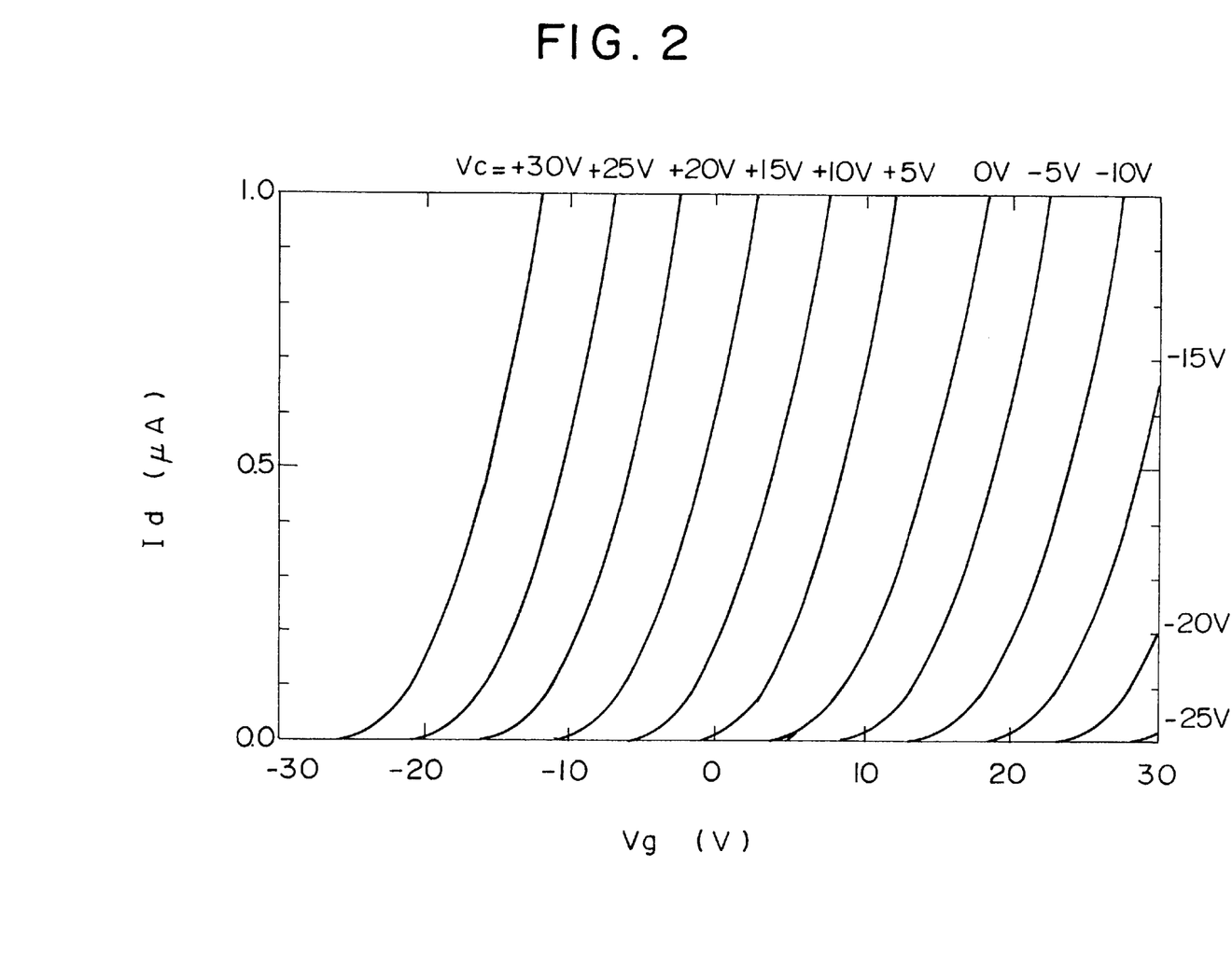
FIG. 2 is a graph showing $I_d$-$V_G$ characteristics of the TFT of the present invention.

The TFT in FIGS. 1A through 1C operates substantially in the same way as ordinary TFTs. Specifically, the potential at the floating gate electrode 102 controls the current flowing between the source and drain electrodes 106, 107 with respect to the threshold of the TFT. The potential at the floating gate electrode 102 is determined by the voltages applied to the input electrodes 108 and 108'. The voltage $V_G$ applied to the input electrode 108 controls the current $I_d$ flowing between the source and drain electrodes, thereby resulting in characteristics $I_d$–$V_G$ unique to the structure of the TFT. When the other input electrode 108' is supplied with a predetermined voltage ($V_c$), the characteristics $I_d$–$V_G$ are shifted in wide range as shown in FIG. 2. Namely, the threshold value of the TFT is apparently changed.

The threshold value of the TFT is generally determined by manufacturing conditions such as the control of an impurity in a channel, and to achieve a required threshold, the manufacturing conditions becomes rigorous and the production yield of the TFT is lowered. Since the TFT of this invention allows the threshold to be adjusted after manufacturing, the rigorous manufacturing conditions required in the manufacturing process is substantially alleviated. This permits larger margins in the design and manufacture of the TFT, thereby improving the production yield of the TFT and reducing substantially the manufacturing cost of the TFT.

The TFT of the present invention is particularly advantageous, because adjusting the threshold value by the addition of an impurity is difficult in an amorphous-based TFT.

As seen from FIG. 2, by adjusting the threshold value, the leakage current is minimized during the off period of the TFT.

For example, if a conventional TFT is employed as a switching device in a liquid crystal display apparatus, the apparatus allows a leakage current during the off period of the TFT to lower the voltage between liquid crystals, thereby dropping image contrast, or unable to achieve a multi-level gradation image. The TFT of the present invention successfully reduces the leakage current to an almost negligible level, thereby maintaining the voltage between liquid crystals, and provides a high image quality display apparatus.

When the TFT of the present invention is employed in a driving circuit or the like, through currents are controlled, and the power consumption is substantially reduced.

The relationship between the voltage applied to the input electrode 108' and the voltage at the input electrode 108 of the TFT, for adjusting the threshold value, is determined by the magnitude of the degree of capacitance coupling of each electrode. The magnitude of capacitance coupling is flexibly changed by the size of each electrode, and the material and thickness of the insulating layer against the floating gate.

Referring to FIGS. 1A through 1C, the TFT with two input electrodes has been discussed. The present invention is not limited to two input electrodes. The use of more input electrodes is perfectly acceptable. With more input electrodes, more functions may be introduced. For example, an n-bit D/A converter in a driving circuit may be constructed of a single TFT having n input electrodes. If n input electrodes are formed on a pixel switching device in a liquid crystal display, n-bit image data (namely, $2^n$-level gradation image data) may be input directly, not via a D/A converter.

With a single input electrode, the above function is not provided. However, if the present invention is applied in a driving circuit in a liquid crystal display apparatus, the output of one circuit stage is directly connected to the input of a subsequent circuit stage via direct wiring, rather than a contact hole, and reliability in wiring is substantially increased.

FIG. 3 shows manufacturing steps of a liquid crystal display apparatus of the present invention, in which the TFT in the driving section is the one of the present invention while the TFT in the pixel section is a conventional one. As shown, the left-hand portion shows the driving section and the right-hand portion shows the pixel portion.

Figure 3A:
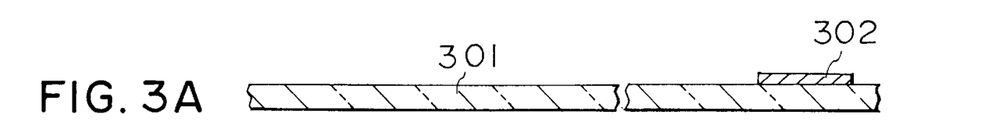
FIGS. 3A through 3F show manufacturing steps of the TFT of the present invention.
Figure 3B:
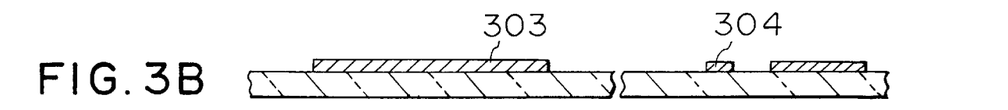
Figure 3C:
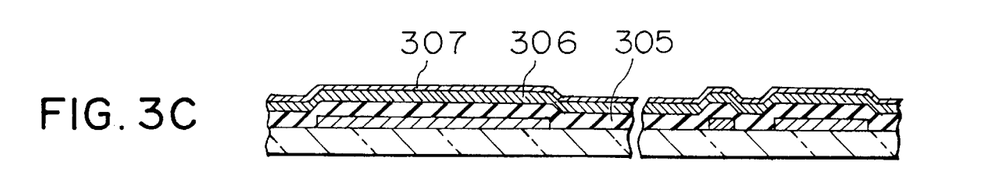

An ITO layer as thick as 70 nm is formed on a glass substrate 301, and is then etched to create a pixel electrode 302 (FIG. 3A). In succession, a Cr layer as thick as 130 nm is formed and then patterned to create a floating gate electrode 303 and a gage electrode 304 (FIG. 3B).

Figure 3D:
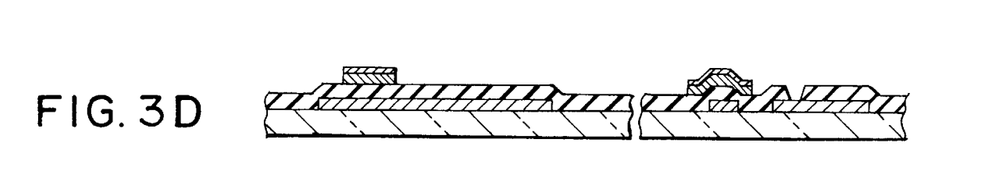

A gate insulating layer (SiN$_x$) 305 as thick as 300 nm, a semiconductor layer (a-Si:H) 306 as thick as 100 nm, and an ohmic contact layer (n$^+$-type a-Si:H) 307 as thick as 20 nm are successively laminated (FIG. 3C), and the semiconductor layer and the ohmic contact layer are isolated one device from another. A contact hole with the pixel electrode 302 is formed in the insulating layer (FIG. 3D).

Figure 3E:
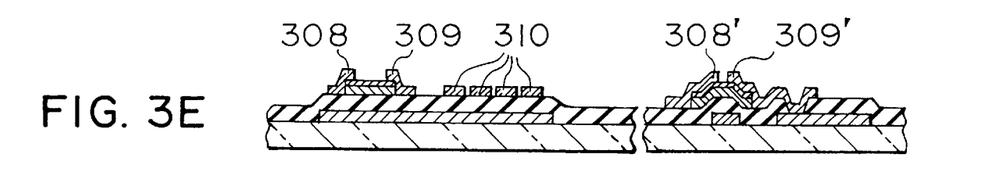

A Cr layer as thick as 130 nm is formed and patterned to create source and drain electrodes 308, 308', 309 and 309' and input electrodes 310 (FIG. 3E).

Figure 3F:
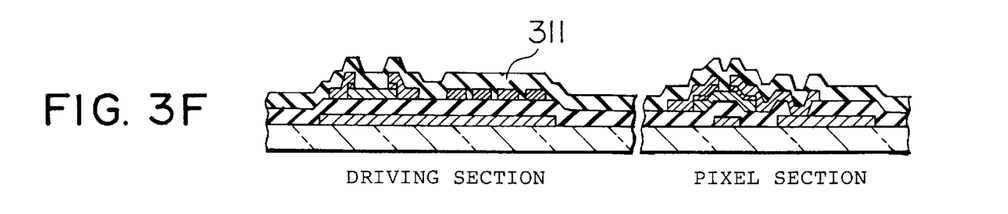

Finally, the ohmic contact layers on the semiconductor layers are etched away, and a passivation layer 311 is formed to complete the manufacturing process of the TFT (FIG. 3F).

As understood from the figures, the TFT device of the present invention is manufactured in the same manufacturing steps as in the conventional TFT.

Furthermore, the TFT in the pixel section can be designed to have a structure identical to that of the TFT of the present invention, and with such TFT incorporated, a diversity of advantages such as a high image contrast may be realized.

The structure of the TFT is not limited to the inverted stagger one shown in FIG. 3. A stagger structure is acceptable. Depending on applications, a diversity of arrangements and manufacturing steps are utilized. FIGS. 4 and 5 show examples.

Figure 4A:
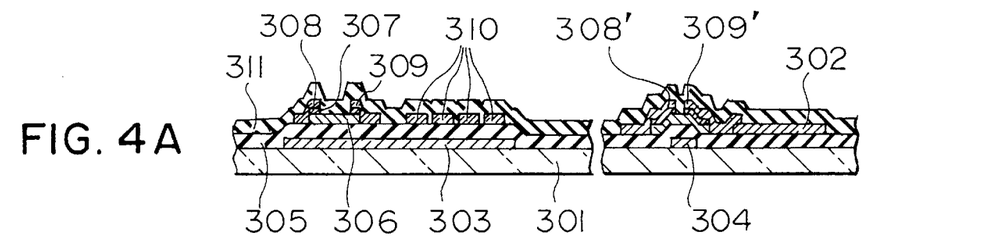
FIGS. 4A through 4E show the structure of a driving section and the TFT in a pixel section in the liquid crystal display apparatus.
Figure 4B:
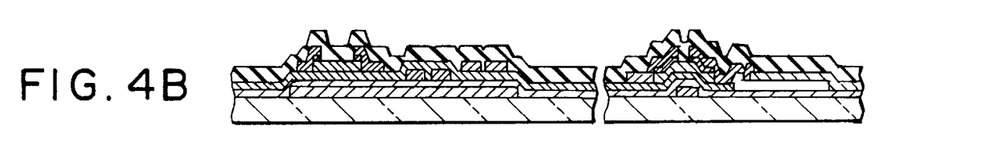

FIG. 4A shows an embodiment in which input electrodes are created in at the same manufacturing step as a pixel electrode. FIG. 4B shows an embodiment in which a gate insulating layer is of a dual-layered structure, in which the degree of capacitance coupling between each input electrode and a floating gate electrode is changed by the thickness of a gate insulating layer. Input electrodes are created at the same manufacturing step as a pixel electrode is formed and other input electrodes are created at the same manufacturing step as source and drain electrodes are formed. As shown in FIG. 4A, the area of the electrodes is a single type of parameter which is considered in designing when predetermined weights are applied to the voltages supplied to the input electrodes. As shown in FIG. 4B, however, the flexibility of design is increased with two types of parameters permitted with the thickness of the gate insulating layer additionally considered.

Figure 4C:
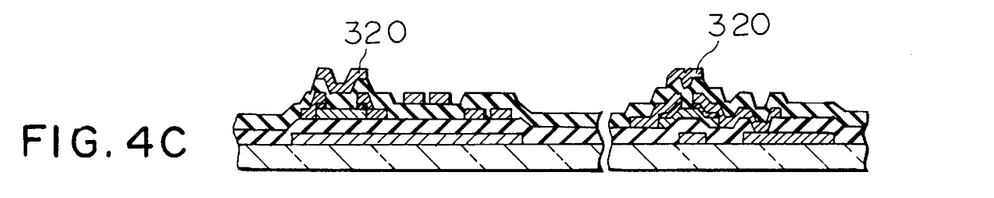

FIG. 4C shows an embodiment in which some of input electrodes are formed at the same manufacturing step as source and drain electrodes are formed, and the remaining input electrodes are formed at the same manufacturing steps as a light shading layer is formed, to make a difference in capacitance coupling the degree of capacitance coupling of the first input electrodes to a floating gate electrode and the degree of capacitance coupling of the second input electrodes to the floating gate electrode.

Figure 4D:
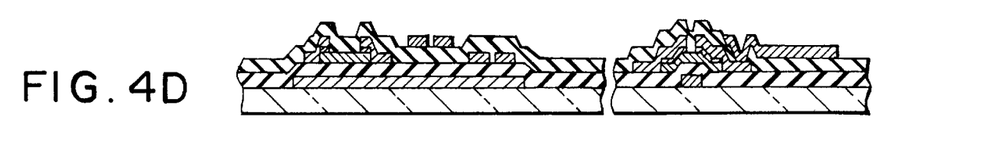

FIG. 4D shows an embodiment in which a pixel electrode and some of input electrodes are formed on top of a passivation layer.

Figure 4E:
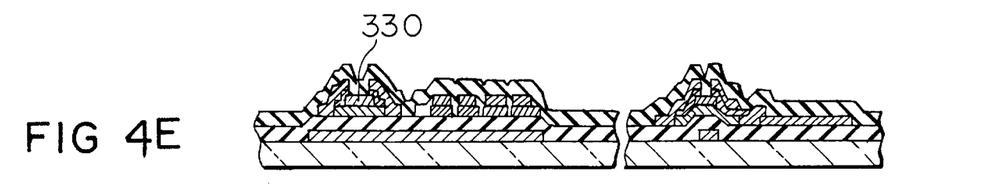

FIG. 4E shows an embodiment in which the degree of capacitance coupling is made different using an etch-stop layer. Some electrodes are formed at the same step as that for the formation of a pixel electrode and the remaining electrodes are formed at the same step as that for the formation of drain electrodes. In this structure, etching away an unnecessary portion of an ohmic contact is easy, variations in the thickness of a semiconductor layer is reduced, and the flexibility of design is increased by capacitance coupling some of the input electrodes to a floating gate electrode via the etch-stop layer in the same way as in the embodiment in FIG. 4B.

In the above embodiments, the floating gate electrode may be anode oxidized. The anode oxidized floating gate makes dielectric breakdown less likely to happen at cross points with the source electrode, drain electrode and a plurality of input electrodes, and increases its dielectric strength.

Figure 5A:
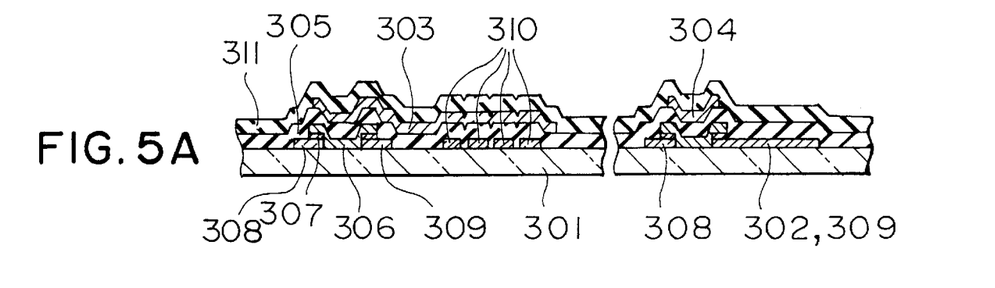
FIGS. 5A through 5D show the structure of the driving section and the TFT in the pixel section in the liquid crystal display apparatus.
Figure 5B:
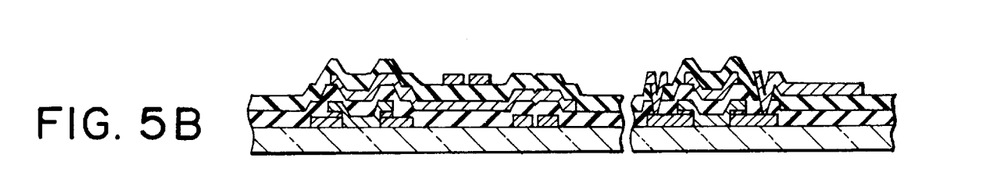
Figure 5C:
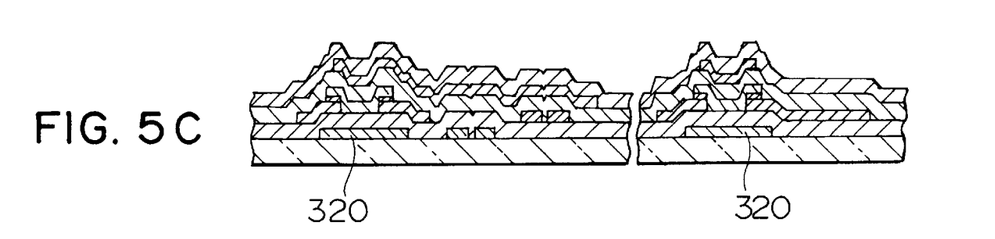

FIGS. 5A, 5B and 5C show stagger type TFTs. FIG. 5A shows an embodiment in which a pixel electrode is formed at the same manufacturing step as that for the formation of source and drain electrodes and input electrodes.

FIG. 5B shows an embodiment in which the degree of capacitance coupling is made different by forming some input electrodes at the same manufacturing step as a pixel electrode and by forming the remaining input electrodes at the same manufacturing step as source and drain electrodes.

FIG. 5C shows an embodiment in which some of input electrodes are formed at the same process as that for a light shading layer. The flexibility of design in applying weights to a voltage supplied to the input electrodes is increased in the same way as described with reference to FIG. 4B.

Figure 5D:
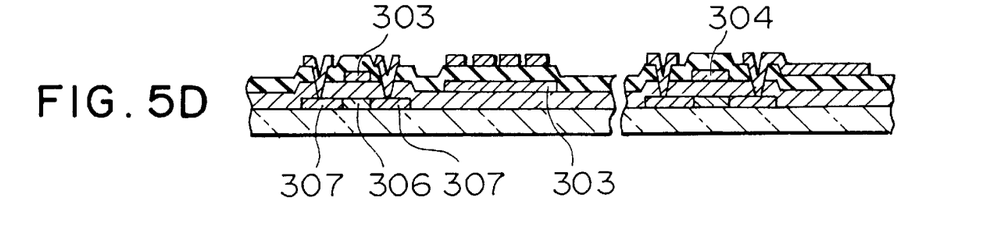

FIG. 5D shows a planar type TFT. This structure allows a source and a drain to be formed in a self-aligned fashion through the ion-doping of a gate electrode as a mask, and is advantageous in reducing stray capacitance. Polysilicon is typically used for the semiconductor layer in this structure. As shown in FIG. 5D, input electrodes are formed at the same time as a pixel electrode is formed. Alternatively, the input electrodes may be formed at the same time as the source and drain electrodes are formed.

As understood from the above discussion, the number of manufacturing steps in the preceding embodiments is not increased compared with the manufacturing process of the conventional TFT.

Although there is no particular limitation on semiconductor materials used in the present invention, amorphous silicon and polysilicon are preferred. Amorphous silicon, which has difficulty setting a threshold, is particularly preferable. A semiconductor heavily doped with an impurity is used as an ohmic contact layer.

Transparent, electrically conductive materials such as ITO, $SnO_2$, and ZnO are preferred for the pixel electrode. Insulating materials such as $SiN_x$ and $SiO_x$ are preferable for the gate insulating layer. Insulating materials such as $SiN_x$ having an excellent selective etching performance is preferable for the ohmic contact layer. Metals such as Cr and Al and transparent, electrically conductive materials such as ITO are used for the input electrode and source and drain electrodes. Metals such as Cr and Al, heavily doped polysilicon and electrically conductive material such as ITO are used for the floating gate electrode. When the floating gate electrode is anode oxidized, metals such as Ta and Al are preferable.

Metals, such as Cr, having an excellent light shading performance are used for the light shading layer.

First Embodiment

Discussed below is a high-contrast liquid crystal display apparatus of a first embodiment of the present invention.

Figure 6A:
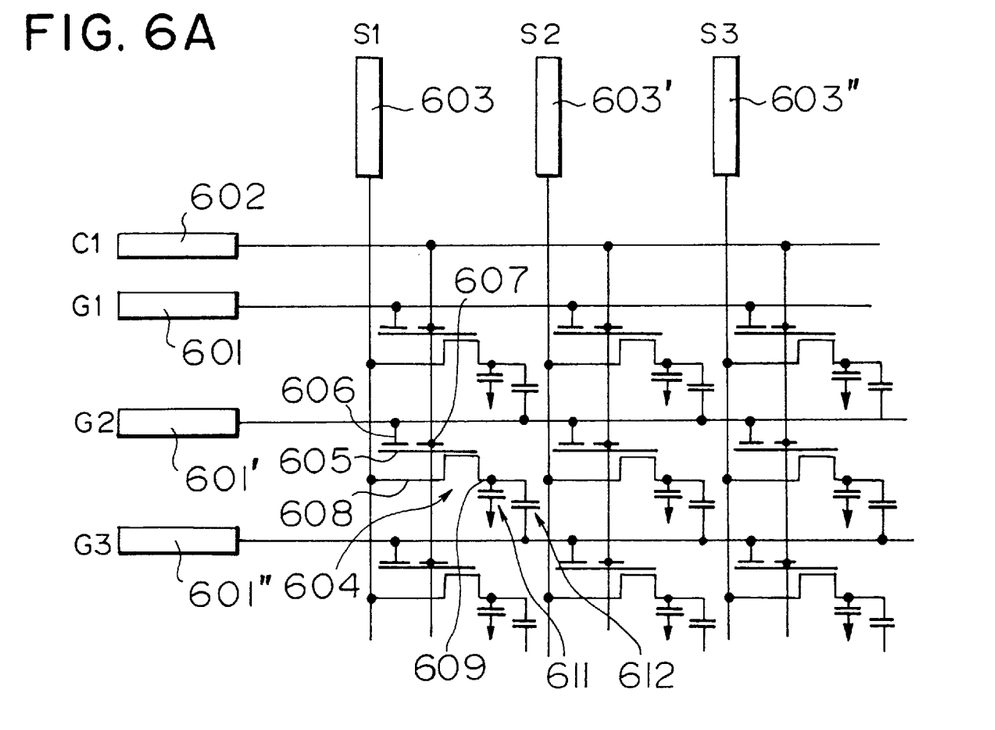
FIG. 6A is a schematic diagram of a liquid crystal display substrate and FIG. 6B shows the structure of the pixel section of the substrate according to a first embodiment of the present invention.
Figure 6B:
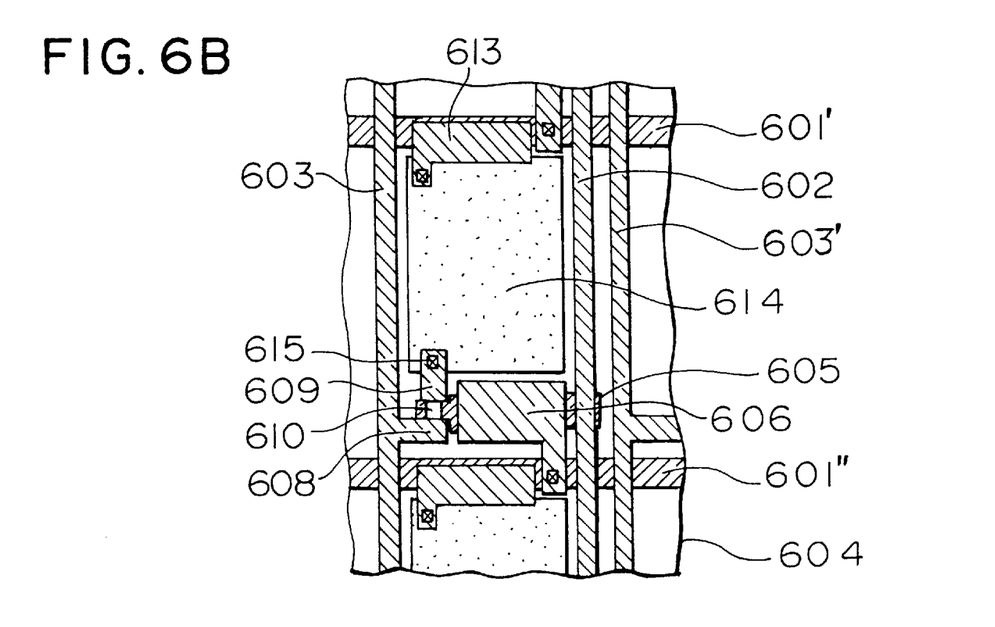

FIGS. 6A and 6B show a TFT substrate in the liquid crystal display and the structure of one pixel, respectively.

Shown in FIGS. 6A and 6B are scanning drive lines 601, 601', 601" (G1, G2, G3, . . . ) and signal lines 603, 603', 603", . . . (S1, S2, S3, . . . ). At each of the crossings where each scanning drive line and each signal line cross, a TFT 604 is arranged. For example, the source 608 of the TFT 604 is connected to the signal line S1, and its drain 609 is connected to a pixel electrode 614. The floating gate 605 of the TFT is capacitance connected, via an insulating layer, to both the input electrode 606 of the scanning drive line G2 and the control electrode 607 of a control line C1.

Designated 611 is a capacitance of a liquid crystal, with one of the two electrodes of the capacitance connected to the pixel electrode 614 and the other electrode connected to a common electrode (not shown) arranged on a substrate facing the pixel electrode. A storage capacitance 612 has an electrode 613. Designated 615 is a contact section. Layers 613, 609, 606, 603, 602 and 603' are made of the same layer.

A driving circuit supplies the first scanning drive line G1 with a voltage to turn it to "H" (for high) state, causing all TFTs connected to the scanning drive line G1 to be on, and in succession, image signals are concurrently supplied via the signal lines S1 through Sn to the respective TFTs connected thereto. A charge in accordance with each signal is stored in the capacitance of each liquid crystal. A duration of time later, the voltage to the scanning drive line G1 turns to "L" (for low) causing all TFTs to be off.

Next, a voltage is supplied to the second scanning drive line G2, image signals are supplied to all TFTs connected to the scanning drive line G2 via the signal lines S1 through Sn, and a charge in accordance with the signal is stored in the capacitance of each liquid crystal.

The above operation is repeated until the last scanning drive line Gm for image displaying, namely until the completion of a scanning of one frame. The operation starts over at the first scanning drive line G1.

Figure 7:
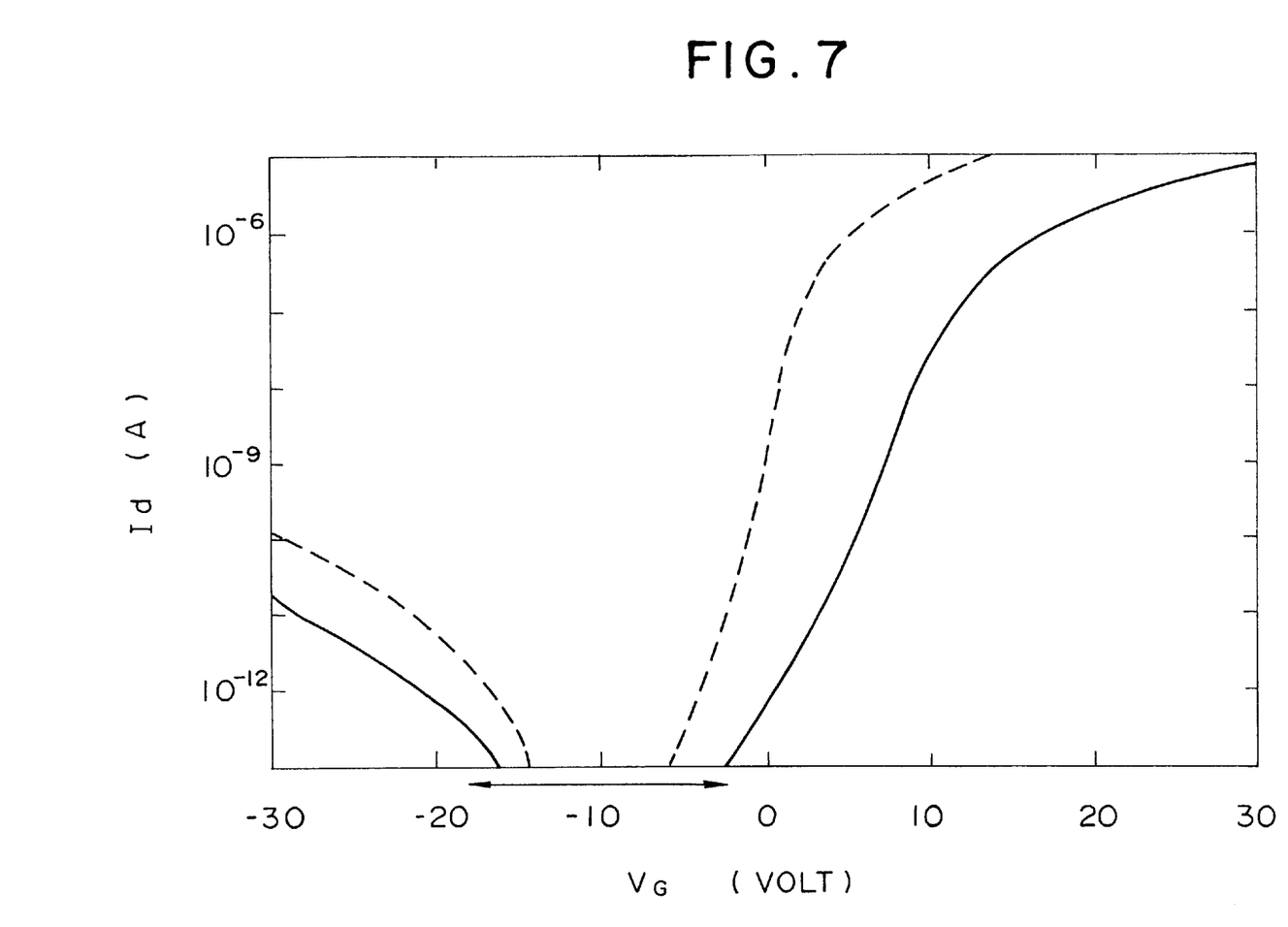
FIG. 7 is a graph that plots the change of a leakage current against the voltage at a control electrode.

FIG. 7 shows $I_d$-$V_G$ characteristics of the conventional TFT and the TFT of the present invention. The TFTs used here have a channel length of 10 $\mu$m and a channel width of 100 $\mu$m. The characteristics of the conventional TFT are shown by a broken line and those of the TFT of the present invention are shown by a solid line. The characteristics are measured with the control electrode supplied with −15 V. An arrow shown in FIG. 7 represents a range of gate voltage that is typically used to turn a TFT off when the TFT is used as a pixel switching device. As seen from FIG. 7, a maximum current of 10 pA flows with the TFT off in the conventional TFT, while the TFT of the present invention controls such a current to 0.1 pA or lower.

If the off current is high, the voltage at the liquid crystal capacitance cannot be maintained, and the voltage will exponentially decay with time. For example, a display apparatus of normally white type suffers a whitened dark state display, with its contrast dropping, and a high image quality display apparatus cannot be provided. Since the display apparatus of the present invention incorporates a TFT with its value allowed to be adjustable, the voltage variation in the liquid crystal can be controlled by adjusting the threshold value to a minimum off current. Thus, a high-contrast, and multi-level gradation image display apparatus results.

A DC current applied to the control electrode is adjusted through a potentiometer. In an actual display apparatus, a user may adjust the image contrast using an external potentiometer to his preference while monitoring the screen of the apparatus.

Second Embodiment

A second embodiment of the liquid crystal display apparatus of the present invention is now discussed.

Figure 8A:
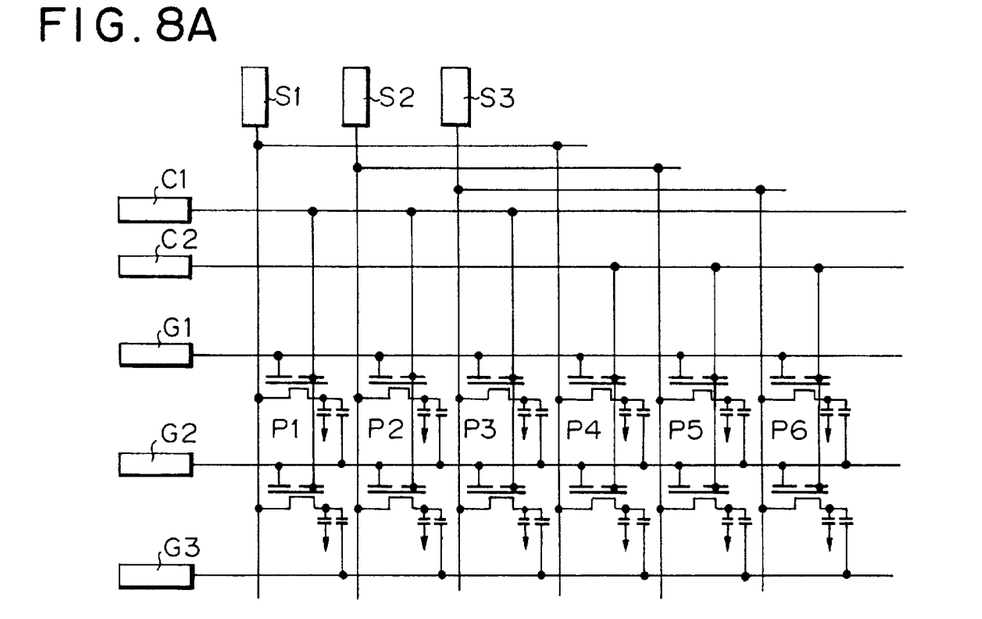
FIG. 8A is a schematic diagram and FIG. 8B is a timing diagram of the liquid crystal display apparatus according to a second embodiment of the present invention.

For simplicity, six pixels are connected to each scanning drive line in FIG. 8A. As shown in FIG. 8A, it should be noted that the six pixels are arranged on a per scanning line basis while the number of signal input terminals are only three.

As for a scanning drive line G1, a control line C1 is connected to the control electrodes of three TFTs (P1 through P3) and a control line C2 is connected the control electrodes of the remaining three TFTs (P4 through P6). The same is true of the other scanning drive lines G2, G3, . . .

Figure 8B:
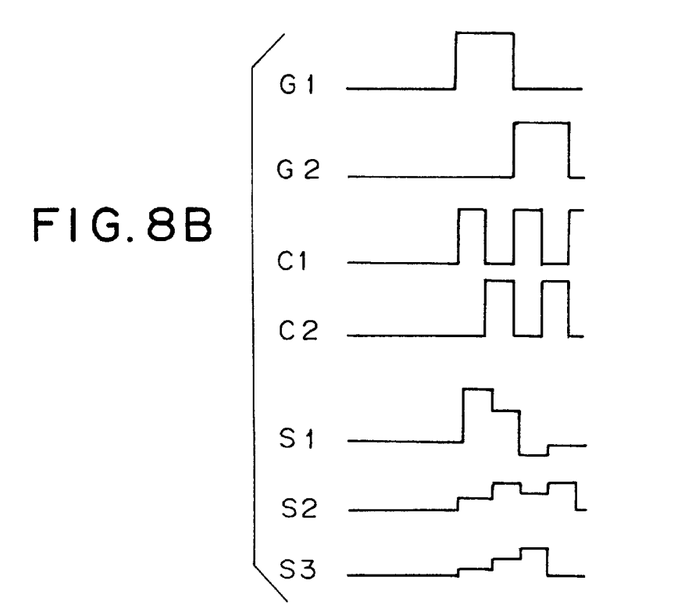

To drive the substrate, an driving operation is performed in accordance with a timing diagram shown in FIG. 8B. First, a predetermined "H" voltage of the transistor is applied to the first scanning drive line G1 (for example, 0 volt for "L" and 25 volts for "H" at G1 and −25 volts for "L" and 0 volt for "H" at C1) to turn the control line C1 high. The image signals for P1 through P3 are concurrently supplied to P1 through P3 via S1 through S3, respectively, and the voltages corresponding to these signals are stored in respective liquid crystal capacitances.

When image signals are concurrently fed to P4 through P6 via S1 through S3, respectively, with the control line C1 driven low and the control line C2 driven high, liquid crystal capacitances are charged with voltages corresponding to these applied signals for image displaying.

The above operation is repeated to the rest of the scanning drive lines, and thus, half the number of input terminals ordinarily used present an image in the same way the apparatus works as shown in FIG. 6.

Now, a source driver and gate driver, each having 240 output lines, in a VGA (1920×480 pixels) are now considered.

In a standard method, 2 gate drivers and 8 source drivers are required. Eight control lines are used to divide the TFTs of each scanning drive line into 8 divisions in the same manner as shown in FIG. 8A, and the number of signal input terminals is reduced to 240, namely a single source driver is sufficient. Cost reduction is achieved by cutting source drivers. The number of connections of TCP (tape carrier package) is reduced by 1672, and time required to make connections is substantially saved. This substantially helps improve productivity and cost reduction of the apparatus. Subsequently, production yield drop due to TCP connection failures is avoided and the reliability of the apparatus is increased.

The pitch of TCP connections is already sufficiently narrow, typically 70 to 100 μm now in the VGAs. The connection pitch will be even finer as the trend to a high-density pixel display continues. A mounting difficulty associated with such a finer pitch is expected to increase. The use of the structure of this embodiment permits a sufficient margin in pitch design.

Third Embodiment

Discussed next is third embodiment in which the TFT of the present invention is incorporated in a shift register of a driving circuit.

Figure 9:
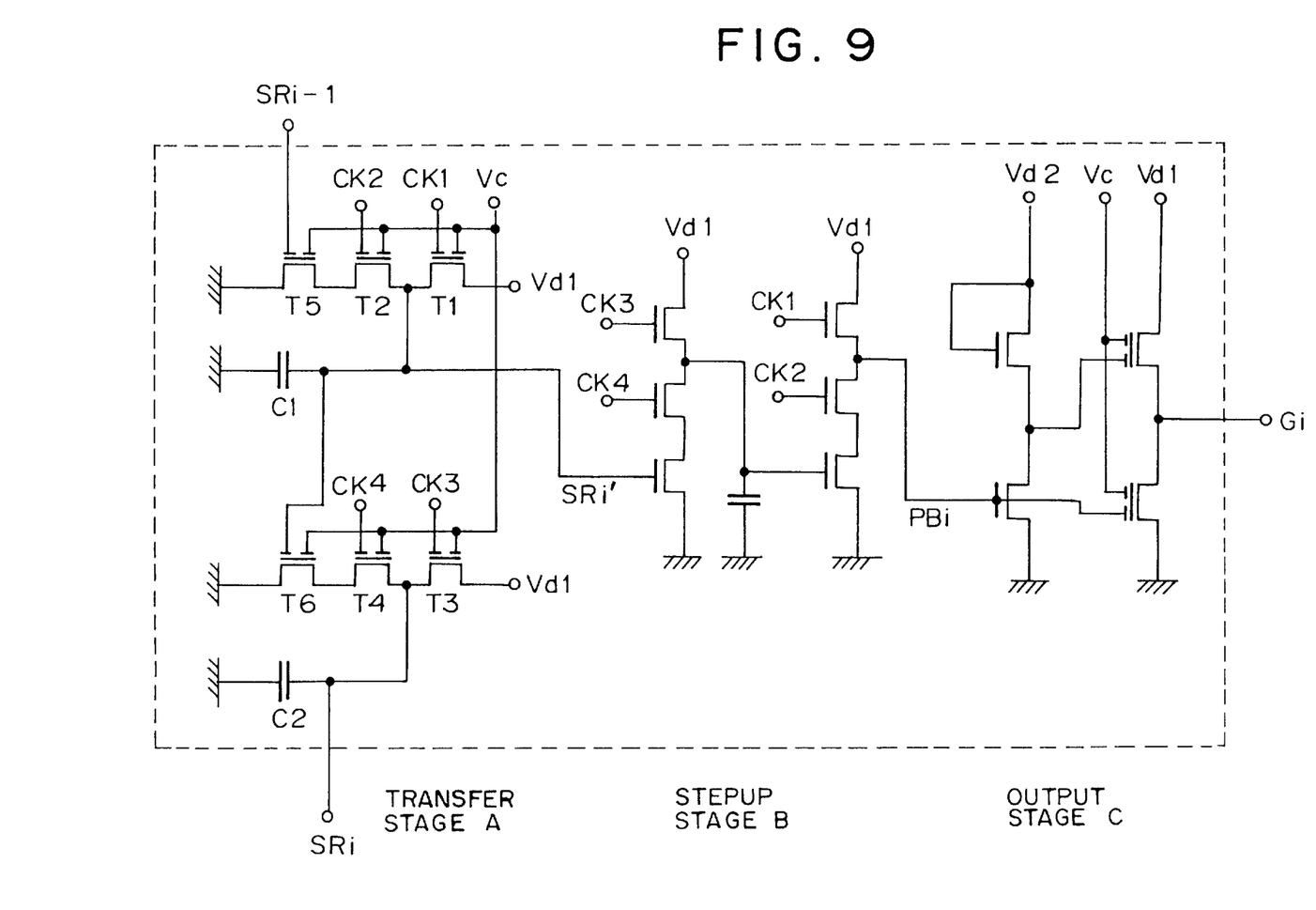
FIG. 9 is a schematic diagram of a shift register according to a third embodiment of the present invention.

FIG. 9 is a schematic diagram showing a part of the shift register that supplies sequentially a voltage to scanning drive lines, corresponding to an i-th scanning line Gi. Shown in FIG. 9 are a transfer stage A, a stepup stage B and an output stage C. Referring to a timing diagram in FIG. 10, the scanning method of this circuit is now discussed.

Figure 10:
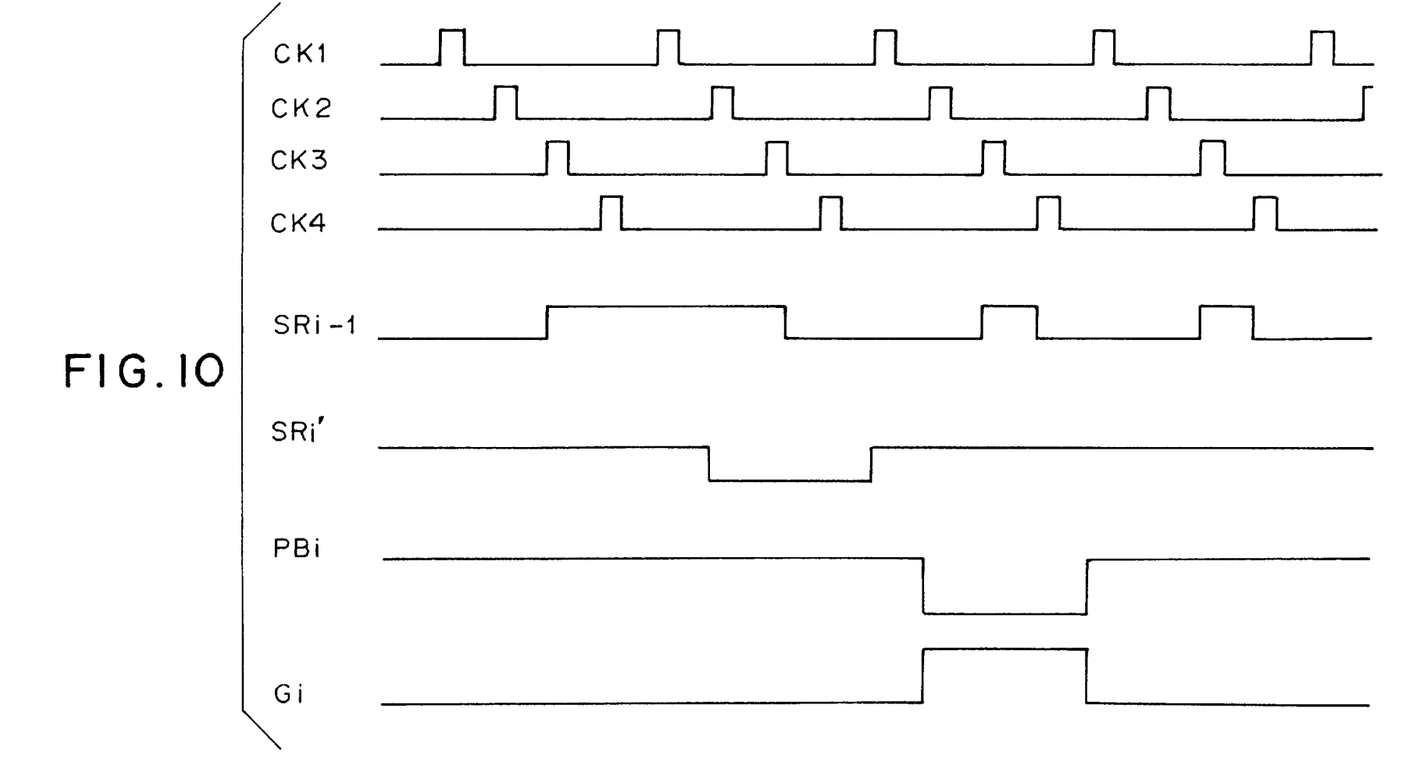
FIG. 10 is a timing diagram of the circuit of FIG. 9.

With a clock signal CK1 going high, a transistor T1 turns on charging a capacitance C1, and driving SRi' high. When the clock signal CK1 goes low and a clock signal CK2 goes high, a transistor T2 turns on. When a previous stage signal SRi-1 is high, Cl is discharged because T5 is on, and SRi' goes low. In this way, a signal transfer to the stepup stage B and the output stage C is performed, and thereby G1 is selected. CK2 goes low, T2 turns off, and CK3 rises, and T3 turns on. C2 is charged, and SRi goes high.

CK3 goes low, turning T3 off. At the moment CK4 rises, T4 turns on. At this moment, the preceding stage SRi-1' (not shown) is high, and SRi-1 is low.

SRi' goes low when both CK2 and SRi-1 are concurrently high. A signal transfer is performed when both CK2 and SRi-1 concurrently go high.

The above is the operation of the signal transfer. If conventional transistors are used for transistors T1, T2 and T5, the driving circuit is used with $V_c=0$ volt in FIG. 7 during off state. Even during off state, a current of 1 nA or so still flows from $V_d1$ to ground in the example in FIG. 7, increasing power consumption. If the TFT of the present invention is used as shown in FIG. 9, and through current is reduced to a current of 1 pA or so, approximately one 1000th the current in the conventional transistor as shown in FIG. 7, by adjusting its threshold value through the application of a predetermined voltage $V_c$ to the control electrode. Although conventional transistors are employed in the stepup stage B in the embodiment shown in FIG. 9, the use of the TFTs of the present invention in this stage is also preferable.

Since the output stage C needs a large driving capability, a transistor of a large W/L ratio (W for channel width and L for channel length) is used. The problem of through currents is even more serious. In this case, again, the use of the TFTs of the present invention resolves the problem. As a result, even if the display apparatus is used as a portable unit, its continuous operation time is substantially increased.

Since the TFTs of the present invention has a variable threshold capability as described above, the associated leakage currents are controlled. Amorphous silicon TFTs are particularly preferred in a high-density, large screen liquid crystal display apparatus.

The liquid crystal display apparatus of the present invention presents a high-contrast, multi-level gradation image. The reduced mounting cost and increased reliability are achieved in the manufacturing process of the apparatus and a substantial overall cost reduction is thus made.

What is claimed is:

1. A thin film transistor device formed on an insulating substrate, the thin film transistor device comprising:

a plurality of input electrodes;

a gate insulating layer, the gate insulting layer comprising at least two insulating layers, including a first insulating layer and a second insulating layer; and a gate electrode that is an electrically floating gate electrode, wherein the floating gate electrode is capacitance coupled to at least one input electrode, at least one of the input electrodes is capacitance coupled to the floating gate electrode via the first insulating layer of the two gate insulating layers, and at least one of the input electrodes is capacitance coupled to the floating gate electrode via the first and the second insulating layers of the two gate insulating layers.

2. A liquid crystal display device wherein the thin film transistor device according to claim 1 is a switching device of picture elements and/or driving circuits.

3. A liquid crystal display apparatus according to claim 2, wherein the switching element and the driving circuit are integrally formed.

4. The thin film transistor device as defined in claim 1, wherein the thin film transistor is an inverted stagger type thin film transistor.

5. The thin film transistor device as defined in claim 1, wherein the thin film transistor is a stagger type thin film transistor.

6. The thin film transistor device as defined in claim 1, wherein the thin film transistor is a planar type thin film transistor.

7. The thin film transistor device as defined in claim 1, further comprising a source drain electrode, wherein at least one of the input electrodes is formed simultaneously with the source drain electrode.

8. A thin film transistor device, formed on an insulating substrate, the thin film transistor device comprising:

a plurality of input electrodes;

a gate insulating layer, the gate insulating layer comprising at least two insulating layers, including a first insulating layer and a second insulating layer; and a gate electrode that is an electrically floating gate electrode, the floating gate electrode is capacitance coupled to at least one input electrode and at least one of the input electrodes is capacitance coupled to the floating gate electrode via an insulating layer other than the gate insulating layers or via the insulating layer and the gate insulating layer.

9. The thin film transistor device as defined in claim 8, wherein the thin film transistor is an inverted stagger type thin film transistor.

10. The thin film transistor device as defined in claim 8, wherein the thin film transistor is a stagger type thin film transistor.

11. A thin film transistor device as defined in claim 8, wherein the thin film transistor is a planar type thin film transistor.

12. The thin film transistor device as defined in claim 8, further comprising a source drain electrode, wherein at least one of the input electrodes is formed simultaneously with the source drain electrode.

13. A liquid crystal display device wherein a thin film transistor device as defined in claim 8 is a switching device of picture elements and/or driving circuits.

14. A liquid crystal display device as defined in claim 13, wherein the switching device for the picture elements and the driving circuits are formed integrally.

* * * * *